United States Patent [19]
Zheng

[11] Patent Number: 6,061,291
[45] Date of Patent: May 9, 2000

[54] MEMORY INTEGRATED CIRCUIT SUPPORTING MASKABLE BLOCK WRITE OPERATION AND ARBITRARY REDUNDANT COLUMN REPAIR

[75] Inventor: Hua Zheng, Fremont, Calif.

[73] Assignee: Winbond Electronics Corporation America, San Jose, Calif.

[21] Appl. No.: 09/115,379

[22] Filed: Jul. 14, 1998

[51] Int. Cl.[7] .................................................. G11C 8/00
[52] U.S. Cl. .................. 365/230.06; 365/200; 365/225.7
[58] Field of Search ..................................... 365/200, 201, 365/225.7, 230.06, 230.08, 189.02

[56] References Cited

U.S. PATENT DOCUMENTS

| | | | |
|---|---|---|---|
| 5,612,918 | 3/1997 | McClure | 365/200 |
| 5,706,292 | 1/1998 | Merritt | 365/201 |
| 5,812,466 | 9/1998 | Lee et al. | 365/200 |

*Primary Examiner*—David Nelms
*Assistant Examiner*—David Lam
*Attorney, Agent, or Firm*—Proskauer Rose LLP

[57] ABSTRACT

A memory circuit column decoder is provided with an array of fuses that can be selectively blown to indicate a fuse address of a defective column of a memory array to be substituted by a redundant column. The memory circuit column decoder also includes a decoder that receives a mask that selectively masks out certain columns of a group of columns from being written during a block write operation, and the fuse address from the array of fuses. The decoder generates a signal for disabling the redundant column during a block write operation when the mask masks out the defective column.

5 Claims, 3 Drawing Sheets

MEMORY INTEGRATED CIRCUIT SUPPORTING MASKABLE BLOCK WRITE OPERATION AND ARBITRARY REDUNDANT COLUMN REPAIR

BACKGROUND OF THE INVENTION

The present invention relates to semiconductor integrated circuit (IC) memory design. In particular, the present invention pertains to graphic RAM ICs with memory arrays that support block write operations and have redundant columns for repairing defective columns of the memory array.

BACKGROUND OF THE INVENTION

A semiconductor memory, such as a synchronous graphics random access memory (SGRAM) IC, includes a memory array of memory cells organized into rows and columns. A particular memory cell can store one bit and is accessed (read or written) by activating a row line of the row of the memory cell and a column line of the memory cell. Here, activate can mean to generate a signal of an appropriate level, or to detect a signal level, on the activated line, whichever is appropriate for the particular operation (read or write). Each memory cell is assigned an address. The address can be separated into a portion identifying the correct row line to be activated and a portion identifying the correct column line to be activated. Row decoders and column decoders are typically provided for decoding the row or column address portions, respectively, into appropriate signals for activating the correct row and column, respectively, of the accessed cell. Columns can be connected to paris of column lines. However, a single column line per column is used for illustrating the invention.

FIG. 1 shows a portion of a column decoder 10 of a RAM. In the particular memory array of the RAM, the column lines are divided into N>1 groups 30-1, 30-2, . . . of plural column lines, in this case, eight column lines. Individual column lines of each group of column lines are activated by a respective column multiplexer 12. Column lines in each group 30-1, 30-2, . . . have an "ordinality" or number defining an ordering of the column lines 30-1, 30-2, . . . in their respective group. As shown the column lines are numbered 0, 1, . . . ,7.

Also provided is a group of redundant repair columns of memory cells and corresponding redundant repair column lines 40. The purpose of the redundant columns of cells and column lines 40 is to selectively replace defective columns of cells and column lines of the groups of column lines 30-1, 30-2, . . . . This increases yield. Replacement is achieved as follows. After fabrication, the column lines 30-1, 30-2, . . . are tested. If a defective column line is detected in a particular group, e.g., column line 2 of group 30-2, then a corresponding column line in the redundant group having the same ordinality, e.g., column line 2 of the group 40, is assigned to the defective column line. Appropriate fuses are blown in the fuse address circuit 20 associated with the column line group 30-2 to generate the fuse address for the defective column 2. Defective columns can be replaced in more than one group, provided that the ordinality of each defective columns is different from each other defective column. Thus, it is possible to also repair a defective column of group 30-1, provided it is column 0,1,3,4,5,6 or 7 (i.e., not column 2) by assigning a corresponding one of the non-assigned column lines 0,1,3,4,5,6 or 7 of the group 40 to the defective column line.

FIG. 2 shows a conventional fuse subcircuit 50 of the fuse address circuits 20, for generating the fuse address bit FA[0], and its complement bFA[0]. One fuse subcircuit 50 is provided for each bit of the fuse address needed to identify the defective column line. In this case, each group of column lines 30-1, 30-2, . . . includes eight columns, so three fuse subcircuits 50 are provided for generating a three bit fuse address FA[2:0]. The fuse F0 is blown to generate the fuse address bit FA[0]='1' or is left intact to generate the fuse address FA[0]='0' during a post fabrication testing process.

In operation, the signal pFUP is first set to a low voltage, while FUN is kept at a low voltage. As such, PMOSFET P0 turns on and charges the node FINT up to a high voltage, while NMOSFET N0 remains off. Subsequently, pFUP is set to a high voltage and FUN is set to a low voltage. As such PMOSFET P0 turns off and NMOSFET N0 turns on.

Assume first that the fuse F0 is blown. In such a case, although NMOSFET N0 is on, the source of the NMOSFET is open circuited. Thus, NMOSFET N0 does not drive FINT to any voltage. The inverter I0 inverts the high voltage of FINT to generate a low voltage for the complement address bit bFA[0]. As such, bFA[0]='0' is generated. The low voltage of bFA[0] is fed to the gates of NMOSFET N3 which remains off and PMOSFET P1 which turns on. PMOSFET P1 thus drives node FINT to the high voltage thereby reinforcing the voltage of the node FINT at the high voltage. Inverter I1 receives the low voltage bFA[0] signal and produces the complement thereof, i.e., the high voltage level fuse address signal FA[0]. As such, the fuse address FA[0]='1' is generated.

Assume now that fuse F0 is not blown but rather is intact. With NMOSFET N0 on, NMOSFET N0 discharges the high voltage of FINT to ground through the fuse F0. As such, inverter 10, which outputs the complement voltage level of FINT, outputs a high voltage as the complement fuse address signal bFA[0]. As such, bFA[0]='1' is outputted. The high voltage complement fuse address signal bFA[0] turns off PMOSFET P1 and turns on NMOSFET N3. In addition, the high voltage level signal pFUP turns on NMOSFET N2. Another conduction path is formed between the node FINT and the low voltage power supply bus through NMOSFETs N2 and N3 thereby reinforcing the low voltage level of FINT. Inverter I1 receives the high voltage level signal bFA[0] and outputs the complement thereof, i.e., the low voltage level signal fuse address FA[0]. As such, the fuse address signal FA[0]='0' is generated.

During operation of the column decoder 10, a column address is decoded as follows. The least significant portion (in this case the three least significant bits) Y[2:0] of the column address are outputted to each comparator 16 of each group 30-1, 30-2, . . . and to the enable circuit 18 of the group 40. The most significant bits of the column address are decoded into a particular column group select signal CGS0, CGS1, . . . . which selects, i.e., enables, a respective column group 30-1, 30-2, . . . , containing the to-be-activated column line. Each column group select signal CGS0, CGS1, . . . , CGSN is received at the comparator 16 of the respective column group 30-1, 30-2, . . . that the column group select signal CGS0, CGS1, . . . enables or disables. Each comparator 16 also receives a fuse address FA [2:0] from the corresponding fuse address circuit 20 indicating which column line of the group 30-1, 30-2, . . . is defective (if any).

The comparator 16 enabled by its respective column group select signal CGS0, CGS1, . . . compares the least significant bits of the column address Y[2:0] to the corresponding fuse address FA[2:0]. If the two addresses match, an enable signal is outputted to the enable circuit 18 which causes the least significant bits of the address Y[2:0] to activate the redundant column of the redundant column line group 40. Otherwise, the comparator 16 outputs the least significant portion of the column address Y[2:0] to the column multiplexer 12 for decoding. The column multiplexer 12 decodes the least significant portion of the address Y[2:0] and activates the appropriate column line.

Graphic RAMs preferably support a block write operation. In a block write operation, the same data value is written to multiple cells in different columns at the same time. To that end, multiple columns are simultaneously activated by the column multiplexers. Advantageously, the block write operation can select amongst the columns that are simultaneously activated through use of a mask signal. For example, if columns are divided into groups of eight, the mask signal can have eight bits, where each bit corresponds to a different column line of each set of column lines. If the corresponding mask bit is set to a particular value, e.g., logic '1', the corresponding column is activated during the block write operation. When set to the opposite logic value, e.g., logic '0', the corresponding column is not activated during the block write operation.

The column decoder architecture 10 of the RAM can be modified to support such an operation as shown. Specifically, a data value to be written is received at a mask circuit 22. The mask circuit 22 also receives an externally generated mask signal bDW. In response to the mask signal bDW, the mask circuit 22 outputs a copy of the received data onto specific ones of the I/O lines 24-0, 24-1, 24-2, 24-3, 24-4, 24-5, 24-6 or 24-7. Illustratively, each I/O line 24-0 to 24-7 corresponds to a corresponding column of each group 30-1, 30-2, . . . . Thus, the mask circuit 22 outputs a copy of the data only onto those of the I/O lines 24-0 to 24-7 corresponding to a column in which the data value is to be stored, as indicated by the mask signal bDW.

As shown, the data values on the I/O lines 24-0 to 24-7 are received at each column multiplexer 12 and at the repair column multiplexer 14. The column multiplexers 12 and repair column multiplexer 14 drive the data value onto only those column lines connected to each column multiplexer 12 or 14 for which a corresponding I/O line 24-0 to 24-7 carries a data value. For example, suppose the column mask signal bDW is '1011 1001' where the bits correspond to columns in increasing column number from left to write. In this case, the mask circuit 22 only outputs the to-be-written data value on I/O lines 24-0, 24-2, 24-3, 24-4 and 24-7. Each column multiplexer 12 or 14 writes the data value onto column lines 0,2,3,4, and 7 of the group of column lines 30-1, 30-2, . . . and 40 connected thereto. Note that no special comparisons need to be made to determine whether or not to activate the redundant columns 40. Each of the repair columns is activated in the same fashion as the groups of columns 30-1, 30-2, . . . , namely, in accordance with the mask.

The redundant column decoder 10 of FIG. 1 provides the advantage of increasing the yield of RAM ICs through use of post-fabrication column repair. However, a RAM IC employing the redundant column decoder architecture 10 cannot repair two columns in different groups having the same ordinality or column number (i.e., a column 3 in group 2 and a column 3 in group 6, etc.). Repair column architectures are known where one repair column is assigned to each group and is freely assignable for repairing any column. This would permit repairing two columns with the same ordinality in different groups. However, such a repair column architecture cannot support a maskable block write.

It is an object of the present invention to overcome the disadvantages of the prior art. Specifically, it is an object of the present invention to enable arbitrary column repair, including repairing columns with the same ordinality in multiple groups, and to support maskable block write operations.

SUMMARY OF THE INVENTION

This and other objects are achieved according to the present invention. According to an embodiment, a memory circuit column decoder is provided with an array of fuses that can be selectively blown to indicate a fuse address of a defective column of a memory array to be substituted by a redundant column. The memory circuit column decoder also includes a decoder which receives a mask that selectively masks out certain columns of a group of columns from being written during a block write operation, and the fuse address from the array of fuses. The decoder generates a signal for disabling the redundant column during a block write operation when the mask masks out the defective column.

Thus, the column decoder includes a decoder that receives the block write mask for determining whether or not to enable the repair column. Such a technique allows use of a repair column architecture in which one (or more) repair columns is allocated to each group of columns and may be freely assigned to repairing any defective column in the group, even if a similar situated or ordinaled column in another group must also be repaired. In short, the architecture of the present invention enables free and arbitrary repair of columns in each group yet also supports maskable block write operations.

DETAILED DESCRIPTION OF THE INVENTION

Figure 1:
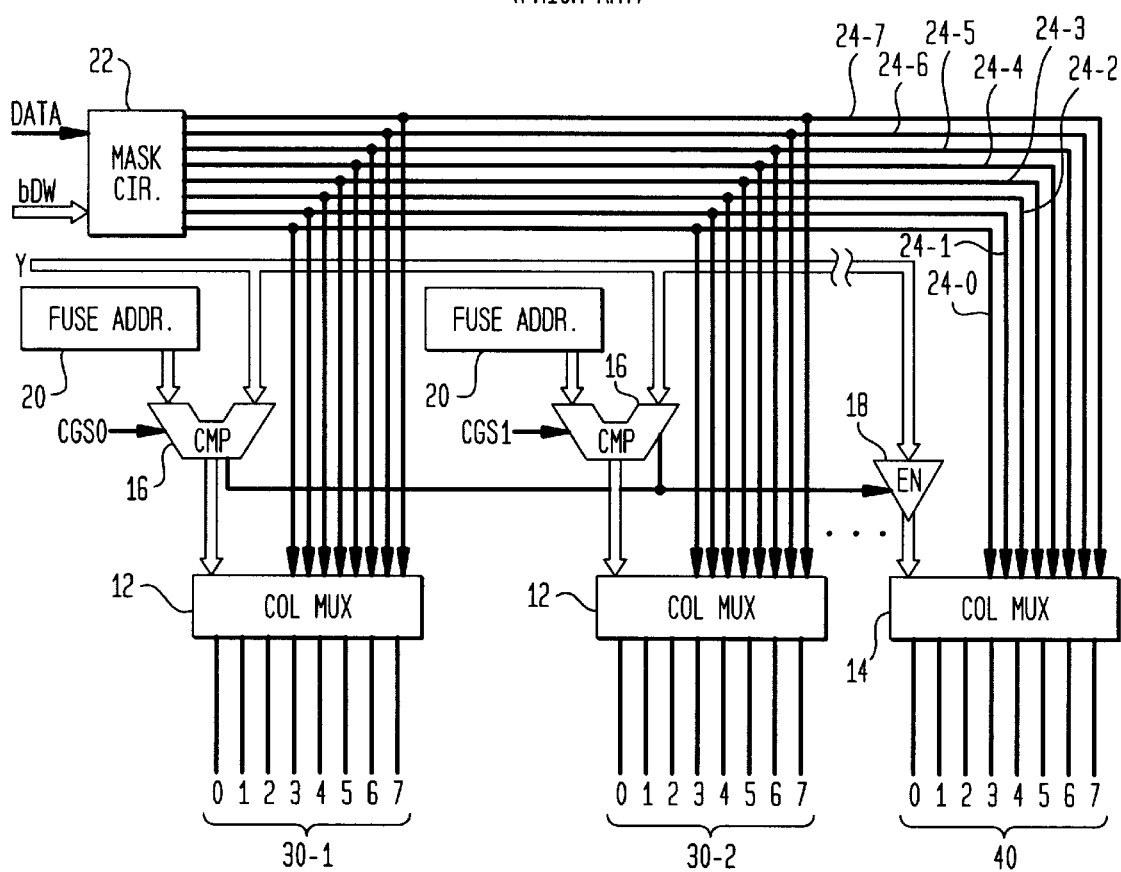
FIG. 1 shows a conventional column decoder 10 with redundant repair columns.
Figure 2:
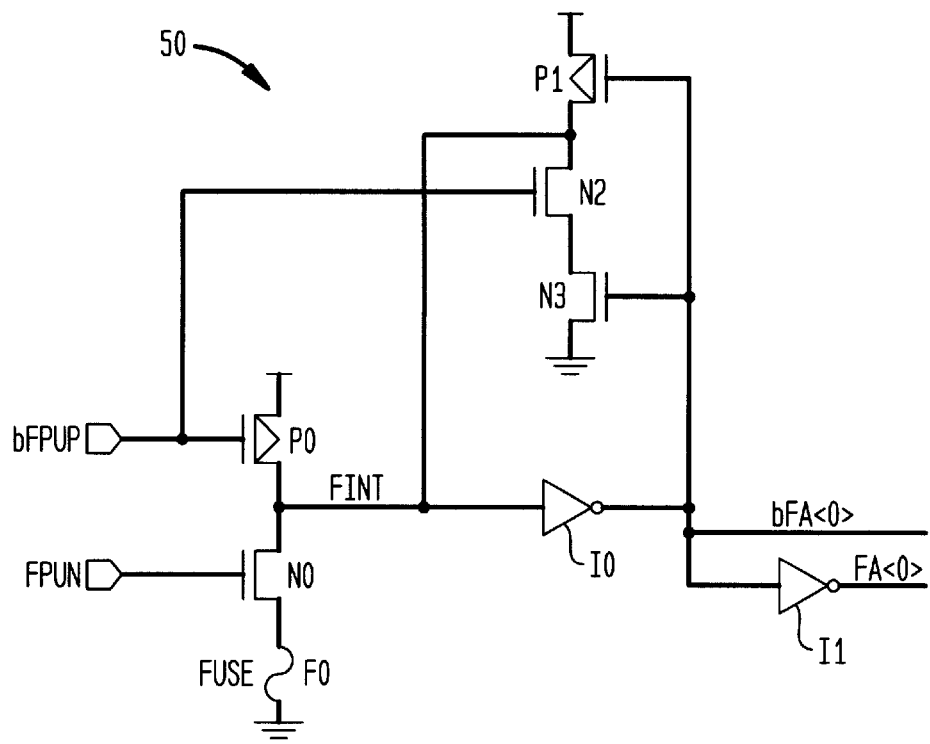
FIG. 2 shows a conventional fuse address circuit in the column decoder 10 of FIG. 1.

FIG. 1 shows part of a column decoder 100 according to an embodiment of the present invention. One set of circuitry 130-1, . . . , 130-N is provided for each of N groups of columns. The circuitry 130-1 for the group of column lines 30-1 is shown in detail and illustratively is replicated N times.

The architecture 100 differs from the architecture 10 of FIG. 1 in at least the following ways. First, the redundant repair column lines, such as repair column line 140, are each allocated to a specific group of columns lines 30-1. The repair column line 140 is shown in the proximity of the circuitry 130-1 associated with the specific group of columns 30-1 to emphasize this point although the repair column lines need not be distributed with their respective allocated groups of column lines 30-1 as such in the actual layout.

Second, a shared mask circuit 22 and multiple I/O lines 24-0 to 24-7 are omitted. Instead, the mask signal bDW is applied directly to each column multiplexer 112 of each group. The column multiplexers 112 include circuitry that output the to-be-written data onto only those column lines 30-1 of the respective group as indicated by the mask signal bDW. During an ordinary read or write operation, the column multiplexers 112 otherwise activate a specific column indicated by the column address portion Y[2:0]. (Not shown for sake of brevity are column group select signals which enable or disable the column multiplexers 112 in response to another portion of the column address.)

Figure 3:
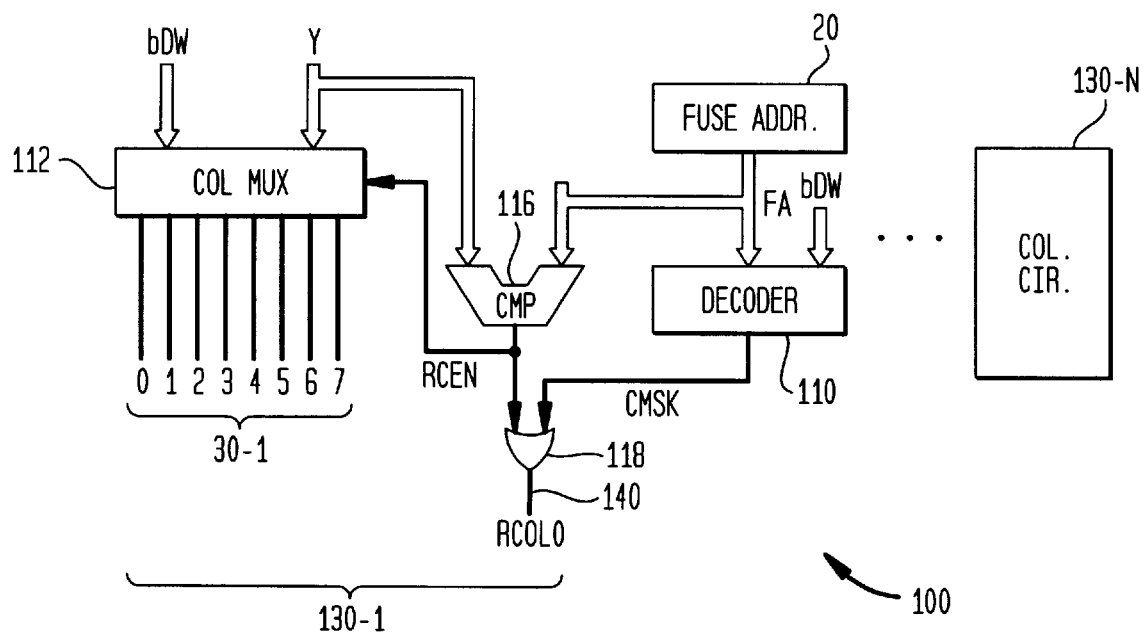
FIG. 3 shows a circuit according to an embodiment of the present invention.

As before, a fuse circuit 20 is provided for each group of column lines 30-1 containing an array of fuses that can be selectively blown to generate a fuse address FA[2:0] of a defective column to be replaced by the redundant repair column 140. This fuse address FA[2:0] is outputted to a comparator 116 which also receives the column address portion Y[2:0] that selects a particular column line of the group 30-1. (Not shown in FIG. 3 for sake of brevity are column group select signals for activating specific groups of column lines in response to a more significant portion of the column address.) Unlike the architecture of FIG. 1, if the fuse address FA[2:0] matches the column address portion Y[2:0], the comparator 116 outputs an enable signal RCEN. This enable signal RCEN may be received at logic OR gate 118 (for reasons that will become apparent from the discussion below) and outputted to activate the repair column line 140. (Another circuit not shown but connected between gate 118 and repair column 140 receives the data value to be stored on the accessed column which drives the to-be-stored data value onto the repair column 140 lines). The signal RCEN also deactivates or prevents the activation of the defective column. In FIG. 3, this is achieved by propagating the signal RCEN to the column multiplexer 112 to disable the column multiplexer 112 when the fuse address FA[2:0] matches the column address portion Y[2:0]. Of course, this can be achieved other ways, such as by disabling the sense amplifiers connected to the column lines of the group 30-1.

Note that the fuse address FA[2:0] is compared to the column address portion Y[2:0] to determine whether to activate the specific repair column 140 allocated to the group of column lines 30-1 or to use the column address portion Y[2:0] to select the addressed column of the group 30-1. The repair columns 140 can be characterized in this architecture as each being allocated for use by a certain group of columns and then assigned to replace a specific column of the group to which it is allocated. Contrast this to the architecture of FIG. 1 where each repair column is allocated to a certain ordinaled column and then assigned to replace the same ordinaled column in a specific group. In the latter architecture of FIG. 1, it is not possible to freely and arbitrarily repair columns in different groups, specifically, the same ordinaled column in each of two or more groups. Such a limitation is not present in the architecture of FIG. 3. Rather, columns may be freely repaired independently of which ordinaled column is repaired in another group.

However, the architecture of FIG. 3 achieves such free and arbitrary repair and also supports maskable block write operations. To that end a decoder 110 is provided in each circuitry set 130-1, . . . , 130-N. The decoder 110 receives the fuse address FA[2:0] from the fuse circuit 20 and the mask signal bDW[7:0]. In response, the decoder 110 generates a signal CMSK for enabling or disabling the redundant column from being accessed during a mask write operation. For example, as shown, the signal CMSK is outputted to the logic OR gate 118 to enable or disable the repair column line 140.

Figure 4:
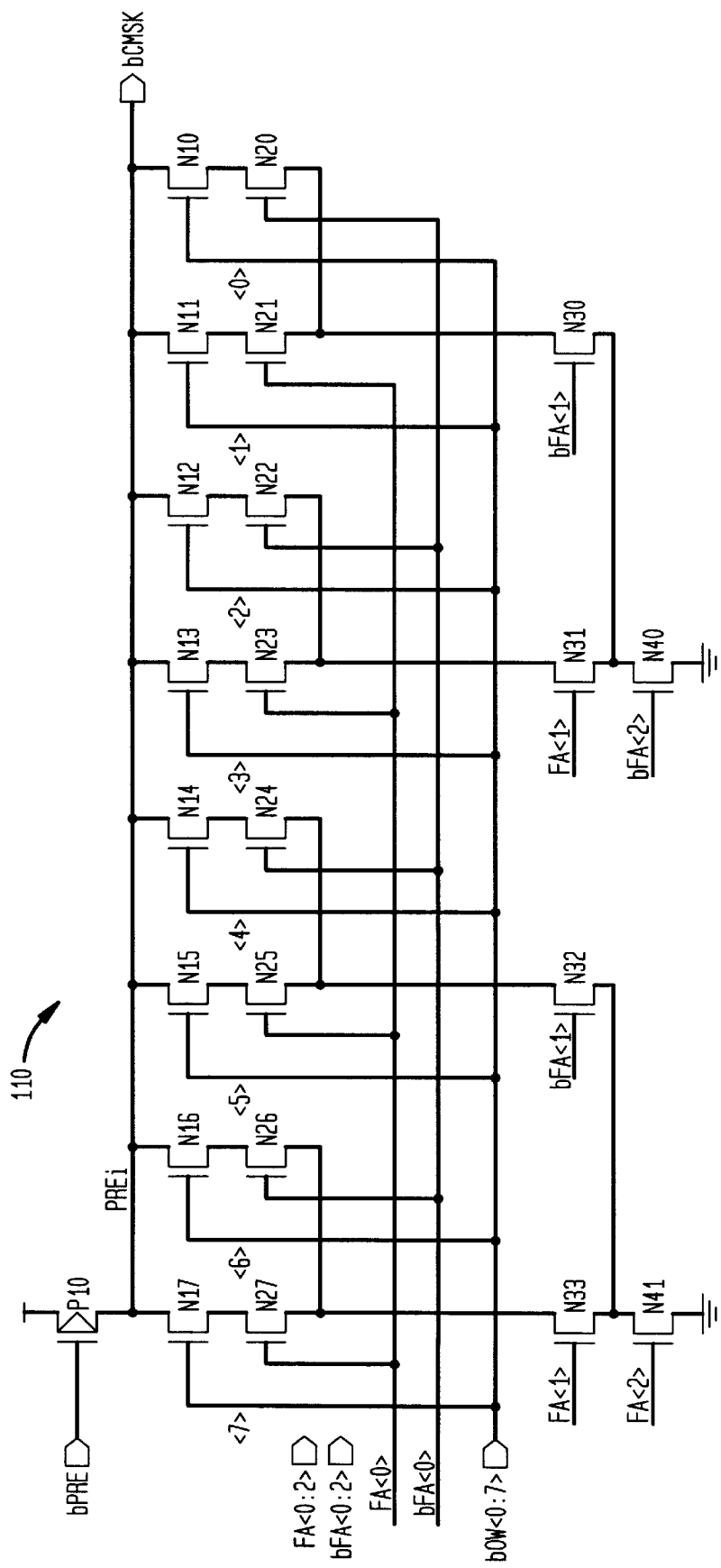
FIG. 4 shows a tree decoder according to an embodiment of the present invention.

Referring to FIG. 4, the decoder 110 is shown in greater detail. The decoder 110 includes an output line labeled PREi, a precharge circuit formed from PMOSFET P10, switches formed from NMOSFETs N10, N11, N12, N13, N14, N15, N16 and N17, and a tree decoder formed from NMOSFETs N20, N21, N22, N23, N24, N25, N26, N27, N30, N31, N32, N33, N40 and N41.

PMOSFET 10 has its source connected to the high voltage power supply bus, its drain connected to the output line PREi and its gate connected to the signal bPRE. In operation, bPRE is initially set to a low voltage to turn on PMOSFET 10 so that it charges up the output line PREi. The signal bPRE is then set to a high voltage so that PMOSFET 10 turns off and does not affect the voltage of the output line.

One switch N10–N17 is provided for each bit of the mask signal bDW[7:0]. The bit bDW[0] is received at the gate of NMOSFET N10. The bit bDW[1] is received at the gate of NMOSFET N11. The bit bDW[2] is received at the gate of NMOSFET N12. The bit bDW[3] is received at the gate of NMOSFET N13. The bit bDW[4] is received at the gate of NMOSFET N14. The bit bDW[5] is received at the gate of NMOSFET N15. The bit bDW[6] is received at the gate of NMOSFET N16. The bit bDW[7] is received at the gate of NMOSFET N17. Each switch N10–N17 has one switched terminal (NMOSFET drain) connected to the output line PREi. Each switch N10–N17 has the other switched terminal (NMOSFET source) connected to one output of the tree decoder N20–N41.

One NMOSFET N20–N27 is provided for each maskable column line, i.e., each column line of a set. The drain of each NMOSFET N20–N27 serves as an output of the tree decoder 110 and corresponds to one of the column lines 0 to 7 of the respective column line group, e.g., group 30-1. The NMOSFET N20 has its drain connected to the source of NMOSFET N10. The NMOSFET N21 has its drain connected to the source of NMOSFET N17. The NMOSPET N22 has its drain connected to the source of NMOSFET N12. The NMOSFET N23 has its drain connected to the source of NMOSFET N13. The NMOSFET N24 has its drain connected to the source of NMOSFET N14. The NMOSFET N25 has its drain connected to the source of NMOSFET N15. The NMOSFET N26 has its drain connected to the source of NMOSFET N16. The NMOSFET N27 has its drain connected to the source of NMOSFET N17. Each of the NMOSFETs N11–N27 receives at its gate the least significant bit of the fuse address FA[0], if that NMOSFET corresponds to a column having a least significant column address bit Y[0]='1', and receives the at its gate the least significant bit of the complement of the fuse address bFA[0], if that NMOSFET corresponds to a column line having a least significant address bit Y[0]='0'. As such, each of NMOSFETs N17, N15, N13 and N11, corresponding to column lines 7, 5, 3 and 1 with address '111', '101', '011', and '001' receives FA[0] at its gate and each of MOSFETs N16, N14, N12 and N10, corresponding to column lines 6, 4, 2 and 0 with address '110', '100', '010', and '000' receives bFA[0] at its gate.

The NMOSFET N30 receives the complement of the second least significant fuse address bit bFA[1] at its gate and has its drain connected to the source of each NMOSFET N20 and N21 corresponding to a column line with second and third least significant column address bits of '00'. The NMOSFET N31 receives the second least significant fuse address bit FA[1] at its gate and has its drain connected to the source of each NMOSFET N22 and N23 corresponding to a column line with second and third least significant column address bits of '01'. The NMOSFET N32 receives the complement of the second least significant fuse address bit bFA[1] at its gate and has its drain connected to the source of each NMOSFET N24 and N25 corresponding to a column line with second and third least significant column address bits of '10'. The NMOSFET N33 receives the second least significant fuse address bit FA[1] at its gate and has its drain connected to the source of each NMOSFET N26 and N27 corresponding to a column line with second and third least significant column address bits of '11'.

The NMOSFET N40 has its source connected to the low voltage power supply bus, receives the complement of the most significant fuse address bit bFA[2] at its gate and has its drain connected to the NMOSFETs N30 and N31 on conduction paths to outputs corresponding to column lines with column address bits having the third least significant bit of '0'. The NMOSFET N41 has its source connected to the low voltage power supply bus, receives the most significant fuse address bit FA[2] at its gate and has its drain connected to the NMOSFETs N32 and N33 on conduction paths to outputs corresponding to column lines with column address bits having the third least significant bit of '1'.

As may be appreciated, the fuse address FA[2:0] and its complement bFA[2:0] establish a conduction path from the output of the tree decoder 110 corresponding to the defective column line indicated by the fuse address FA[2:0] to the low voltage power supply bus. For example, if the column line 5, with address '101' were defective, the fuse address FA[2:0] would be '101' and the complementary fuse address bFA[2:0] would be '010'. As such, NMOSFETs N41, N32, N30, N27, N25, N23 and N21 would be on and the NMOSFETs N40, N31, N33, N20, N22, N24 and N26 would be off. A conduction path would be established from the drain of N25, corresponding to defective column line 5, via N25, N32 and N41, to the low voltage power supply bus. Likewise, the mask signal bDW[7:0] turns on each switch corresponding to a non-masked column line. Thus, if the column line is not masked, but is defective, a conduction path is established between the output line PREi and the low voltage power supply bus discharging the high voltage placed thereon by the precharge circuit P10. The low or high voltage signal of the output line PREi is outputted as the enabling or disabling signal bCMSK, a high voltage disabling the activation of the redundant, repair column line and a low voltage enabling the activation of the redundant repair column line. The signal bCMSK can then be easily inverted to produce the signal CMSK.

The above discussion is intended to be merely illustrative of the invention. Those having ordinary skill in the art may devise numerous alternative embodiments without departing from the spirit and scope of the following claims.

The claimed invention is:

1. A memory circuit comprising:
   an array of fuses that can be selectively blown to indicate a fuse address of a defective column of a memory array to be substituted by a redundant column,
   a decoder for receiving a mask, that selectively masks out certain columns of a group of columns from being written during a block write operations, and said fuse address from said array of fuses, said decoder for generating a first signal for disabling said redundant column during said block write operation when said mask masks out said defective column,
   a column multiplexer receiving column address, a mask single and a second signal for enabling single column specified by said column address, said column multiplexer also for simultaneously enabling each of one or more columns specified by said mask signal and for disabling each column masked out by said mask signal, and
   logic circuitry receiving said fuse address, said column address, and said first signal, said logic circuitry for generating said second signal for disabling said column multiplexer when said fuse address matches said column address, said second signal also for enabling said redundant column, said lock circuitry also for disabling said redundant column in response to said first signal.

2. The memory circuit column decoder of claim 1 wherein said redundant column is allocated to a specific group of columns and is freely assignable to any column of said group of columns, independently of any other column of any other group to which another redundant column is assigned, by selectively blowing said fuses of said array of fuses.

3. The memory circuit column decoder of claim 1 wherein said decoder comprises:
   a precharge circuit for charging an output line with a first level of said generated signal that enables said redundant column,
   a tree decoder, having a plurality of outputs including one output corresponding to each column line that can be indicated by said fuse address, said tree decoder decoding said fuse address to establish a conduction path from a power supply bus of a second signal level opposite to said first signal level, to a said output of said tree decoder corresponding to said defective column indicated by said fuse address, and
   a plurality of switches, including one switch corresponding to each output of said tree decoder, each switch having one switch terminal connected to said output line, one switch terminal connected to said corresponding output of said tree decoder and a control terminal connected to a signal line carrying a bit of said mask corresponding to a column of said output.

4. The memory circuit column decoder of claim 1 further comprising:
   a comparator receiving said fuse address from said fuse circuit and an address of a cell accessed during an operation other than a block write operation, and disabling said redundant column if said address is different from said fuse address.

5. The memory circuit of claim 4 further comprising:
   a group of column lines associated with said comparator, array of fuses and said decoder, and
   a column multiplexer connected to said group of column lines, said column multiplexer receiving said address of said accessed cell during said operation other than said block write operation and activating a specific one of said columns of said group corresponding to said address when said comparator disables said redundant column,
   wherein said redundant column is freely assignable to any of said columns of said group by selectively blowing said fuses of said array of fuses to generate said fuse address of a specific one of said columns of said group replaced by said redundant column.

* * * * *